United States Patent
Hatakeyama

(10) Patent No.: US 6,337,820 B1
(45) Date of Patent: Jan. 8, 2002

(54) DYNAMIC MEMORY DEVICE PERFORMING STRESS TESTING

(75) Inventor: Atsushi Hatakeyama, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/688,043

(22) Filed: Oct. 12, 2000

(30) Foreign Application Priority Data

Dec. 10, 1999 (JP) .............................. 11-352370

(51) Int. Cl.[7] .................................................. G11C 7/00
(52) U.S. Cl. ................................... 365/201; 365/189.04
(58) Field of Search ........................... 365/201, 230.03, 365/189.04, 202, 189.08, 196, 230.06

(56) References Cited

U.S. PATENT DOCUMENTS 5,493,532 A * 2/1996 McClure .................... 365/201
5,793,685 A * 8/1998 Suma ......................... 365/201
5,805,523 A * 9/1998 Lysinger ................. 365/230.08

* cited by examiner

Primary Examiner—Trong Phan
Assistant Examiner—Thong Le
(74) Attorney, Agent, or Firm—Arent Fox Kintner Plotkin & Kahn, PLLC

(57) ABSTRACT

A dynamic memory device having a plurality of bit line pairs, a plurality of word lines, and a plurality of memory cells disposed at intersections thereof. The dynamic memory device includes a data bus and sense amplifiers. The data bus is connected a write amplifier. The sense amplifiers are provided to each of the bit line pairs, for amplifying voltage between the bit line pairs. In a stress testing mode, a plurality of the bit line pairs are commonly connected to the data bus, the write amplifier applies high and low voltages to the simultaneously connected bit line pairs, and thereafter the sense amplifiers associated with the selected bit line pairs are activated.

12 Claims, 8 Drawing Sheets

DYNAMIC MEMORY DEVICE PERFORMING STRESS TESTING

BACKGROUND OF THE INVENTION

1. Field of the Invention

The present invention relates generally to a dynamic memory device, and, more particularly, to a dynamic memory device ensuring an effective application of high and low level of voltages between bit line pairs in stress testing.

2. Description of the Related Art

Dynamic memory devices (or DRAMs) necessitate not merely high speed with large capacity but also high reliability. As measures for improving the reliability, stress testing is made in which stress is applied to the devices before delivery to make clear the defects formed during the manufacturing process. In this stress testing, to make clear the short between the adjacent bit line pairs, which is a typical defectiveness of the memory devices, alternate high and low level of voltages are applied between the adjacent bit line pairs so as to change unfinished defects occurring between the bit line pairs upon the manufacture into finished defects. Operation testing is made after such a stress application, to thereby prevent less reliable defectives from being put on the market.

To externally apply voltages to a bit line pair in the ordinary memory devices, however, high and low level of voltages must be applied to a pair of bit lines selected, by utilizing a write command, through a path which consists of an external terminal, a write amplifier, a data bus and a bit line pair. A large-capacity dynamic memory device comprises a plurality of memory banks each including a plurality of memory blocks, each of which is provided therein with a memory cell array having a plurality of bit line pairs. It is possible in such a case to utilize the operation mode for activating the plurality of memory banks at a time, to thereby externally apply a desired voltage to the bit line pairs of each memory bank at the same time. However, only a single memory block can be selected within the memory bank, and only a single bit line pair can be selected within the memory block.

Therefore, insofar as the function in the ordinary operation is utilized, the stress testing merely allow extremely few bit line pairs of the entire chip to simultaneously be subjected to high and low voltages. Accordingly, an elongated time is required for the stress testing, resulting in a rise of the product testing costs.

In the dynamic memory devices, due to some reasons such as operation testing, a function has hitherto been proposed by which selection is made of a plurality of bit line pairs or all bit line pairs for the connection to the data bus pair. Another function has also been proposed by which a plurality of memory blocks are selected to connect the global data bus pair to the local data bus pairs of the plurality of memory blocks. It is conceivable with the addition of such functions to increase the number of bit line pairs simultaneously subjected to high and low level of voltages in the stress testing, to thereby shorten the stress testing time.

However, as long as the conventional write command is utilized irrespective of use of the above plural bit line pair selection function or plural memory block selection function, it would be impossible to expect for the write amplifier to have a drive ability sufficient to invert all the sense amplifiers connected to the plurality of bit line pairs. The activation of the sense amplifier is needed for the drive of the bit line pairs into sufficiently high and low levels, whereas the existence such a sense amplifier poses an impedance to the case where simultaneous stress is applied to a plurality of bit line pairs in the stress testing.

SUMMARY OF THE INVENTION

It is therefore an object of the present invention to provide a memory device having a shortened stress testing time.

It is another object of the present invention to provide a memory device capable of simultaneous application of high and low level of voltages to a plurality of bit line pairs.

In order to achieve the above objects, according to a first aspect of the present invention, upon stress testing mode more bit line pairs than ordinary write mode are commonly connected to a data bus, and a write amplifier applies high and low voltages to the simultaneously connected bit line pairs. Thereafter, at a different timing than an ordinary writing, the sense amplifiers associated with the selected bit line pairs are activated to drive the bit line pair, for the application of sufficient voltage.

In the first aspect, in case of a configuration where the data bus includes a global data bus and a plurality of local data buses connectable thereto, and the bit line pairs are selectively connected to the local data bus, in the stress testing mode more local data buses than the ordinary write mode are placed in connection with the global data bus. Then, the write amplifier is connected to the global data bus.

In the ordinary write mode, after the drive of the word lines the sense amplifier is activated to drive the bit line pairs. The write amplifier then drives the bit line pairs so that write data are written into the memory cell. Thus, the write amplifier needs to invert the already activated sense amplifier connected to the selected bit lines. According to the first aspect of the present invention, as opposed to this, in the stress testing mode, after the drive of the bit lines by the write amplifier while the sense amplifiers are not activated, the sense amplifiers are driven, so that there is no need to invert the plurality of sense amplifiers by the write amplifier, enabling the write amplifier to drive a plurality of bit line pairs.

In a more preferred embodiment, a stress testing mode signal is externally fed as a specific signal or command to the memory device, and a stress application data signal is fed through the data input/output terminal so that a plurality of bit line pairs more than the ordinary mode are connected to the data bus to drive the bit line pairs by the write amplifier into high and low levels. At the timing after the elapse of a certain period of time, a sense amplifier activation timing signal is externally fed to activate the sense amplifiers corresponding to the selected bit line pairs so as to drive the bit line pairs into high and low levels. The above data signal and sense amplifier activation timing signal may specially be generated by an internal circuit.

According to the present invention described above, the existing write amplifier can be utilized for simultaneous stress application to a plurality of bit line pairs so that the stress testing time can be reduced.

To attain the above objects, according to a second aspect of the present invention there is provided a dynamic memory device having a plurality of bit line pairs, a plurality of word lines, and a plurality of memory cells provided at the intersection thereof, the dynamic memory device comprising: a data bus to which a write amplifier is connected; and sense amplifiers provided to each of the bit line pairs for amplifying voltage between the bit line pair; wherein in a stress testing mode, a plurality of bit line pairs are commonly connected to the data bus, the write amplifier applies high and low level of voltages to the commonly connected bit line pairs, thereafter the sense amplifiers associated with the selected bit line pairs are activated.

DESCRIPTION OF THE PREFERRED EMBODIMENTS

The present invention will now be described with reference to the accompanying drawings which illustrate presently preferred embodiments of the present invention in a non-limitative manner, i.e., in such a manner as not to limit the technical scope thereof.

Figure 1:
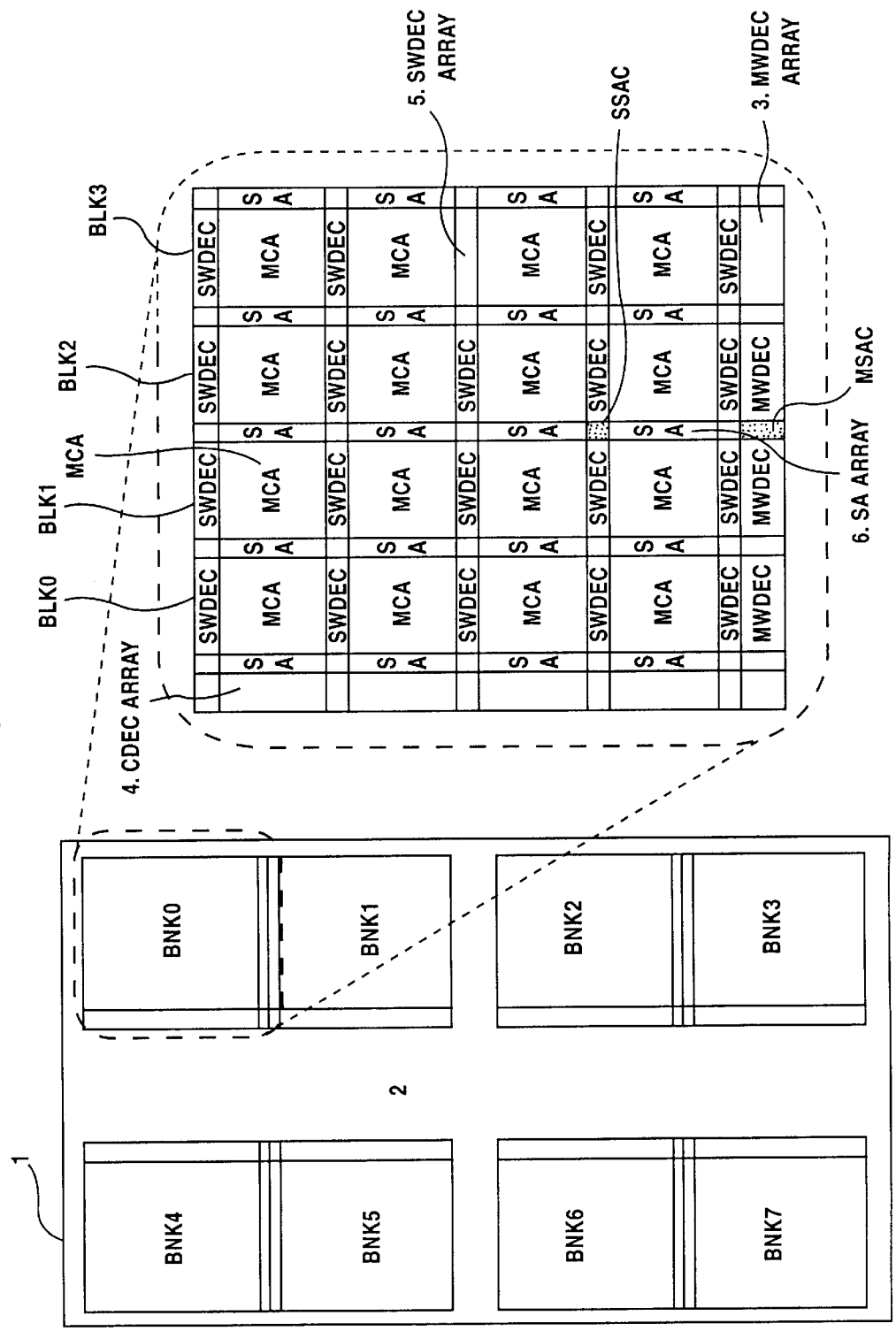
FIG. 1 a shows general configuration of a dynamic memory device in accordance with an embodiment of the present invention.

FIG. 1 is a general configuration diagram of a dynamic memory device in accordance with an embodiment. A chip 1 is shown on the left of the drawing, with the configuration of a single memory bank BNK0 within the chip 1 being shown in an enlarged scale on the right of the drawing. The chip 1 shown in FIG. 1 includes therein eight memory banks BNK0 to BNK7 and a peripheral circuit part 2. As shown on the right in FIG. 1, each memory bank is divided into a plurality of memory blocks BLK0 to BLK3, and provided with a main word decoder MWDEC array 3, a sub word decoder SWDEC array 5 and a column decoder CDEC array 4. The peripheral circuit part 2 is provided with not shown a timing generator for generating various control signals in response to operation commands, an address buffer, a data buffer, an address decoder, etc.

Each memory block BLKn is subdivided into a plurality of memory cell arrays MCA, each having not shown a plurality of bit line pairs, word lines, and memory cells disposed at intersections therebetween, the word line of each memory cell array MSA being selected by the sub word decoder SWDEC, with the bit line pairs being driven by adjacent sense amplifiers SA.

A sense amplifier circuit part SA array 6 has the memory cell arrays MCA disposed on both sides thereof such that when the memory cell array bit line pairs on one hand are connected to the sense amplifier circuit part SA, the memory cell array bit line pairs on the other are cut off from the sense amplifier circuit part SA. In other words, the sense amplifier circuit part SA is a shared sense amplifier which is shared by the memory cell arrays MCA disposed on both sides thereof.

Thus, the memory block BNKn is selected by a block selection signal generated by the main word decoder for row address decoding, more specifically, a bit line transfer signal generation circuit, with the selected memory cell array MCA bit line pairs being connected to the sense amplifiers SA. Selection of the sense amplifier is therefore made on the basis of the block selection signal. The memory cell array bit line pair are selected by a column selection signal generated by the column decoder for column address decoding and is connected to a data bus line not shown.

Figure 2:
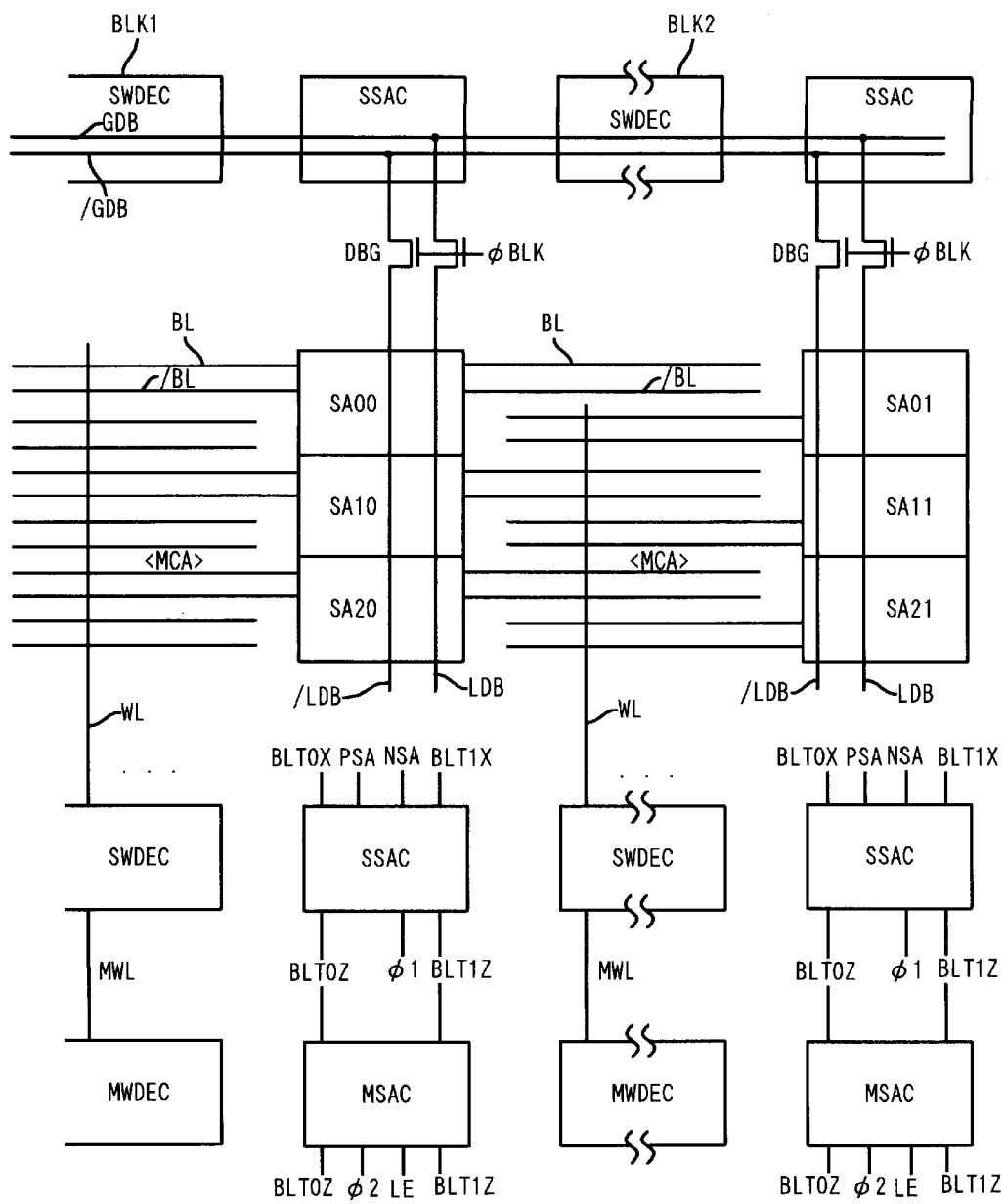
FIG. 2 is a configuration diagram of a memory cell array and a sense amplifier array.

FIG. 2 is a configuration diagram of the memory cell array and the sense amplifier array. FIG. 2 partially shows the memory blocks BLK1 and BLK2 of FIG. 1. A sense amplifier SA array is interposed between the memory cell array MCA. The memory cell array MCA includes therein a plurality of bit line pairs BL, /BL, and a plurality of word lines WL intersecting the plurality of bit line pairs, with memory cells not shown being arranged at the intersections. For example, the bit line pair BL, /BL are arranged on both sides of a sense amplifier circuit part SA00 such that the bit line pair on the selected side is connected to the sense amplifier circuit part SA00 by bit line transfer signals BLT0X, 1X which the sub sense amplifier control circuit SSAC generates.

For the word line WL, a main word line MWL is selected by the main word decoder MWDEC for decoding some of row addresses, and a word line WL is selected and driven by the sub word decoder SWDEC for decoding the other some of the row addresses. Each sub word decoder SWDEC drives the word line WL within the memory cell array MCA corresponding thereto.

A main sense amplifier control circuit MSAC and a sub sense amplifier control circuit SSAC make up a circuit for controlling a connection between the sense amplifier and the bit line pair and an activation of the sense amplifier. The main sense amplifier control circuit MSAC is shared by the memory blocks BLKn, and the sub sense amplifier control circuit SSAC is provided for each memory cell array MCA for providing a direct control of the adjacent sense amplifier circuit array. Bit line transfer signals BLT0x, 1x providing a control of connection between the sense amplifier and the bit line pair are generated from a logical inversion signal BLT0z, 1z thereof. Sense amplifier activation signals PSA, NSA providing a control of activation of the sense amplifier are generated in response to a sense amplifier activation timing signal LE. In this embodiment, the sense amplifier activation timing signal LE is internally generated at a predetermined timing upon the ordinary operation, and is externally fed at an appropriate timing upon the stress testing.

Stress testing mode signals φ1 and φ2 are generated upon the stress testing mode and are fed to the sub sense amplifier circuit SSAC and the main sense amplifier circuit MSAC, respectively, so as to provide a control allowing a simultaneous connection of a plurality of bit line pairs with the data bus line. The stress testing mode signals φ1 and φ2 are preferably fed to all the control circuits MSAC and SSAC to enable the selection of all the memory blocks and the activation of all sense amplifiers.

As can be seen in FIG. 2, the data bus pair include a global data bus pair GDB, /GDB shared by the plurality of memory blocks BLKn and a plurality of local data bus pair LDB, /LDB provided for each sense amplifier array. A data bus gate DBG controlled by a block selection signal φBLK provides a selective connection between the global data bus pair GDB, /GDB and the local data bus pair LDB, /LDB. It is to be noted in the stress testing mode that more selections are made of those block selection signals φBLK than upon the ordinary operation and that all is preferably put in the selected state so that all the data bus gates DBG become conductive so as to allow a plurality of local data bus pairs LDB, /LDB to simultaneously be connected to the global data bus pair GDB, /GDB. The block selection signals φBLK are generated by a bit line transfer signal generation circuit not shown for decoding some of the row addresses.

Figure 3:
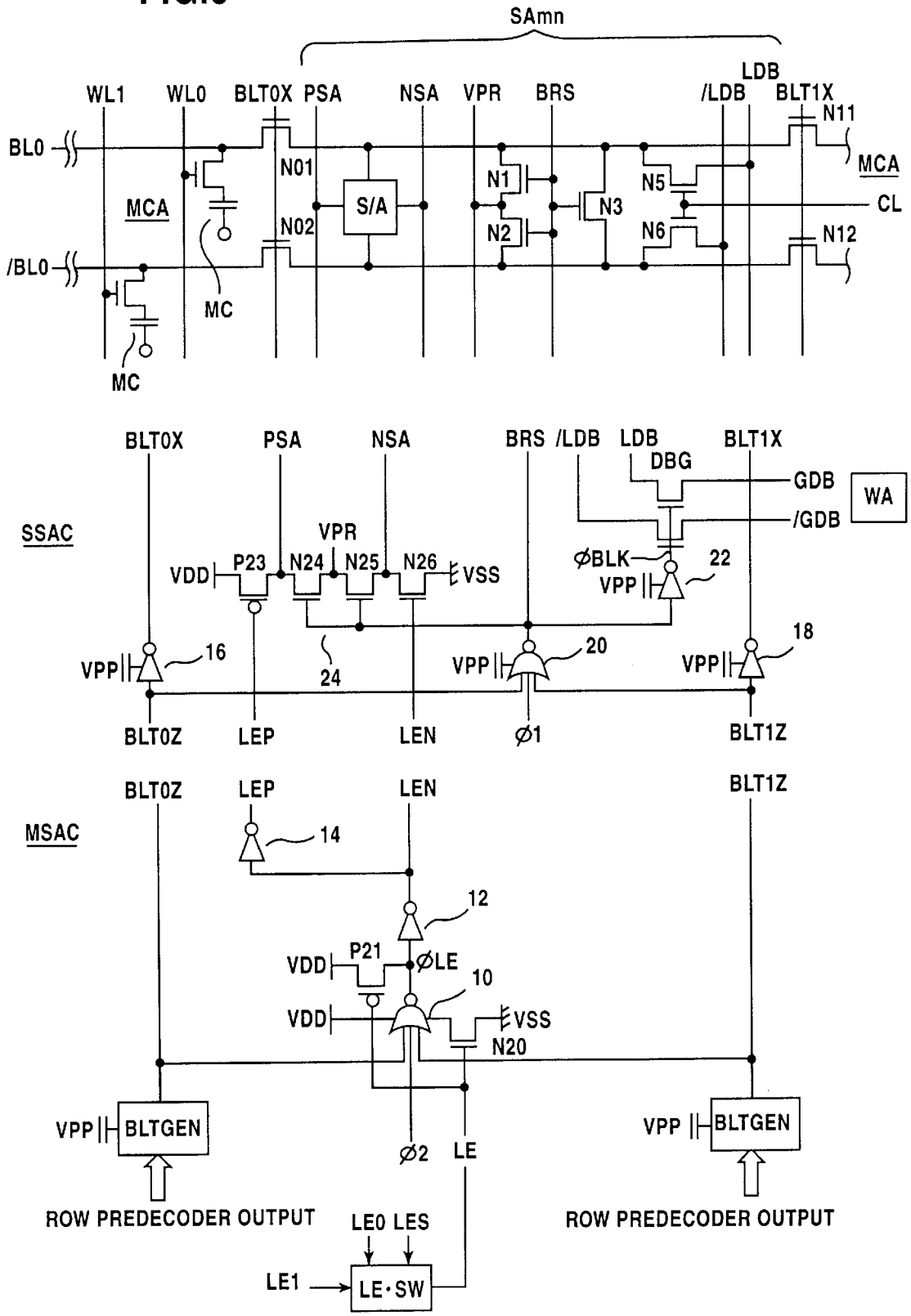
FIG. 3 is a specific circuit diagram of a sense amplifier circuit part SAmn, a main sense amplifier control circuit MSAC and a sub sense amplifier control circuit SSAC.

FIG. 3 illustrates a specific circuit including a sense amplifier circuit part SAmn, a main sense amplifier control circuit MSAC, and a sub sense amplifier control circuit SSAC. In the diagram there are shown a power supply VDD, a step-up power supply VPP having a higher voltage than the power supply VDD, and aground power supply VSS. Unless particularly stated, an inverter, a NOR gate, etc., are CMOS circuits connected to the power supply VDD and the ground VSS. An N-channel MOS transistor and a P-channel MOS transistor are designated at reference numerals N and P, respectively.

FIG. 3 depicts at its upper potion the sense amplifier circuit part SAmn and the memory cell arrays MCA disposed on both sides thereof. The sense amplifier circuit part SAmn includes therein (1) a sense amplifier S/A for detecting and driving a voltage difference between bit line pairs in response to sense amplifier activation signals PSA and NSA; (2) transistors N1, N2 and N3 providing a bit line reset circuit for short circuiting the bit line pairs and connecting the bit line pairs to a precharge voltage VPR in response to a bit line reset signal BRS; and (3) transistors N5 and N6 of a column gate circuit providing a connection between the bit line pair BL, /BL and the local data bus pair LDB, /LDB in response to a column selection signal CL.

On both sides of the sense amplifier circuit part SAmn are disposed bit line transfer gates N01, N02 and N11, N12 by way of which right and left bit line pairs BL, /BL are selectively connected to the sense amplifier circuit part. The bit line transfer gates N01, N02 and N11, N12 are controlled to be active or inactive by bit line transfer signals BLT0x, 1x which the sub sense amplifier circuit SSAC generates.

The memory cell array MCA is provided therein with a plurality of bit line pairs BL, /BL, a plurality of word lines WL0, WL1, and a memory cell at the intersection thereof consisting of one transistor and one capacitor.

Control signals controlling the sense amplifier circuit part are generated by the main sense amplifier control circuit MSAC and the sub sense amplifier control circuit SSAC. Bit line transfer signals BLT0x, 1x, sense amplifier activation signals NSA, PSA, and bit line reset signals BRS of those control signals are arranged so as to extend over the sense amplifier array region where the sense amplifier circuit parts SAmn are arranged, to thereby control the operations in the interiors of the respective sense amplifier circuit parts SAmn.

The main sense amplifier control circuit MSAC is provided with a bit line transfer signal generation circuit BLTGEN which is fed with outputs of a row predecoder not shown for decoding row addresses and which generates bit line transfer signals BLT0z, 1z. The main sense amplifier control circuit MSAC includes a NOR gate 10 which is fed with bit line transfer signals BLT0z, 1z and with a stress testing mode signal φ2, transistors N20, P21 for activating the NOR gate 10 by a sense amplifier activation timing signal LE, and inverters 12 and 14.

In this main sense amplifier control circuit MSAC, when either one of bit line transfer signals BLT0Z, 1z goes high from L level in the precharged state upon the ordinary operation, the output of the NOR gate 10 results in a high-level enable state. In this high-level enable state, the timing signal φLE goes low at the timing when the sense amplifier activation timing signal LE goes high thereafter. As a result, the sense amplifier activation timing signal pair LEN and LEP are controlled to be high and low, respectively. That is, when the memory block BLK is in unselected state, both the bit line transfer signals BLT0z, 1z remain low, whereas when the memory block BLK is in selected state, either one goes high. Thus, in the selected memory block, the sense amplifier activation timing signal pair LEN and LEP go high and low, respectively. In the unselected memory block, the sense amplifier activation timing signal pair LEN and LEP remain low and high, respectively.

The sense amplifier activation timing signal pair LEN and LEP are fed to transistors N26 and P23 of a sense amplifier activation signal generation circuit 24 within the sub sense amplifier control circuit SSAC. When the activation timing signal pair LEN and LEP are high and low, respectively (in the memory block selected state), the sense amplifier activation signals NSA and PSA are driven into the ground VSS level and power supply VDD level, respectively, with the sense amplifier S/A being activated. As opposed to this, when the signal pair LEN and LEP are low and high, respectively (in the unselected state), both the sense amplifier activation signals NSA and PSA keep the precharge level VPR(=VDD/2), with the sense amplifier S/A being unactivated.

In the sub sense amplifier control circuit SSAC, during the time when both the bit line transfer signals BLT0Z and BLT1Z are low in the precharged state, bit line transfer signals BLT0X and BLT1x obtained by inverting them and remaining high are fed to the bit line transfer gates N01, N02 and N11, N12, thus rendering the gates conductive. In this state, the bit line pair on both sides are connected to a precharge circuit, etc., of the sense amplifier circuit part. A NOR gate 20 is fed with bit line transfer signals BLT0z and BLT1z and a stress testing mode signal φ1, and when they both are low a bit line reset signal BRS is high to render the transistors N1, N2 and N3 conductive, causing the bit line pair on both sides to be short-circuited and connected to the precharge voltage VPR. Transistors N24 and N25 within the sense amplifier activation signal generation circuit 24 also becomes active so that the sense amplifier activation signals PSA and NSA are both kept at the precharge voltage VPR, with the sense amplifier S/A remaining inactivated.

Upon a change from the precharged state to the active state, either one of the bit line transfer signals BLT0Z and BLT1z goes high, whilst the bit line reset signal BRS as the output of the NOR gate 20 goes low. In response to this, all the transistors N1, N2 and N3 of the bit line reset circuit become non-conductive, and the transistors N24 and N25 of the sense amplifier activation signal generation circuit 24 become also non-conductive.

As described above, the change to the high level of either one of the bit line transfer signals BLT0Z and BLT1Z means that selection of that memory block. Thus, when the bit line reset signal BRS goes low as a result of the selection of a memory block, the block selection signal φBLK goes high by way of the inverter 22, allowing the data bus gate DBG conductive so that the local bus pair LDB and /LDB belonging to that memory block are connected to the global data bus pair GDB and /GDB, respectively.

When either one of the bit line transfer signals BLT0z and BLT1z goes high, either the inversion signal BLT0x or BLT1x goes low. As a result, the bit line transfer gate N01, N02, N11 or N12 corresponding to unselected one of the bit line pair become inactive, thus isolating the unselected one of the bit line pair from the sense amplifier S/A.

Then, upon the stress testing mode, both the stress testing mode signals φ1 and φ2 go high. The two signals φ1 and φ2 differ in merely that the signal φ1 has the high level equal to the step-up power supply VPP level and the signal φ2 has the high level equal to the power supply VDD level, respectively, but are the same in logic. The stress testing mode signals φ1 and φ2 are fed to all the sense amplifier control circuits MSAC and SSAC of the memory bank. These stress testing mode signals φ1 and φ2 both go high upon the stress testing mode to put all the memory blocks in the selected state, rendering all the block selection signals φBLK high in the activated state.

In response to the high level of the sense amplifier activation timing signal LE, upon the stress testing mode, the sense amplifier activation signals PSA and NSA go high and low, respectively, in the activated state, to thereby activate the sense amplifier S/A at the timing of a sense amplifier activation timing signal LE. Selection of the sense amplifier activation timing signal LE is made by selection signals LES such that an internally generated timing signal LED is selected upon the ordinary operation and that an externally fed timing signal LE1 is selected upon the stress testing mode. This means that upon the stress testing mode the sense amplifier activation timing is externally controlled.

In all the memory blocks, upon the stress testing mode, the bit line transfer signals BLT0z and BLT1Z remain low, with all the bit line transfer gates becoming conductive. In the stress testing mode, all the column selection signals CL are controlled to be high. Upon the stress testing mode, therefore, all the bit line pairs BL, /BL are connected to corresponding write amplifiers WA by way of the column gates N5, N6, the local data bus pair LDB, /LDB, the data bus gate DBG, and the global data bus pair GDB, /GDB.

Then, keeping the sense amplifiers inactivated, the write amplifier drives all the bit line pairs to be high or low so that in response to external timing signal LE1 after the elapse of a predetermined time all the sense amplifiers are activated to apply a sufficient stress voltage to the bit line pairs.

With reference to the peripheral circuits, description will then be made in the mentioned order of operations upon the active mode, the write mode and the stress testing mode of the dynamic memory device of this embodiment. Herein, the synchronous DRAM (SDRAM) is described by way of example.

For the read operations, currently prevailing SDRAMs issue an active command together with a row address to select and drive a word line corresponding to the selected memory cell, to thereby read data stored in the memory cell into the bit line pair. At the timing when the data are read into the bit line pair, the sense amplifier is activated to drive the bit line pair. Subsequent to the active command, a read command is input together with a column address to select a column gate corresponding to the selected memory cell and then select the local data bus so that output is provided from the output circuit by way of the global data bus.

For the SDRAM write operation, after input of the same active command as the above, a write command is fed together with a column address and write data to drive the selected bit line pair from the write amplifier by way of the global data bus, the local data bus and the column gate. When opposite phase data are written as a result of this driving operation, the state of the sense amplifier is inverted.

The memory device of this embodiment has, in addition to the above ordinary operation modes such as active mode, read mode and write mode, another operation mode, i.e., the stress testing mode. In this stress testing mode, a specific command, etc., different from the ordinary modes is issued and all the bit line pairs are connected to the write amplifier by way of all the local data buses and global data buses such that the write amplifier drives all the bit line pairs into desired high or low levels, after which all the sense amplifiers are activated by an externally fed sense amplifier activation timing signal LE1, to drive all the bit line pairs into a higher level.

The difference between the above ordinary operations and the stress testing mode operation will become apparent from the following description.

Figure 4:
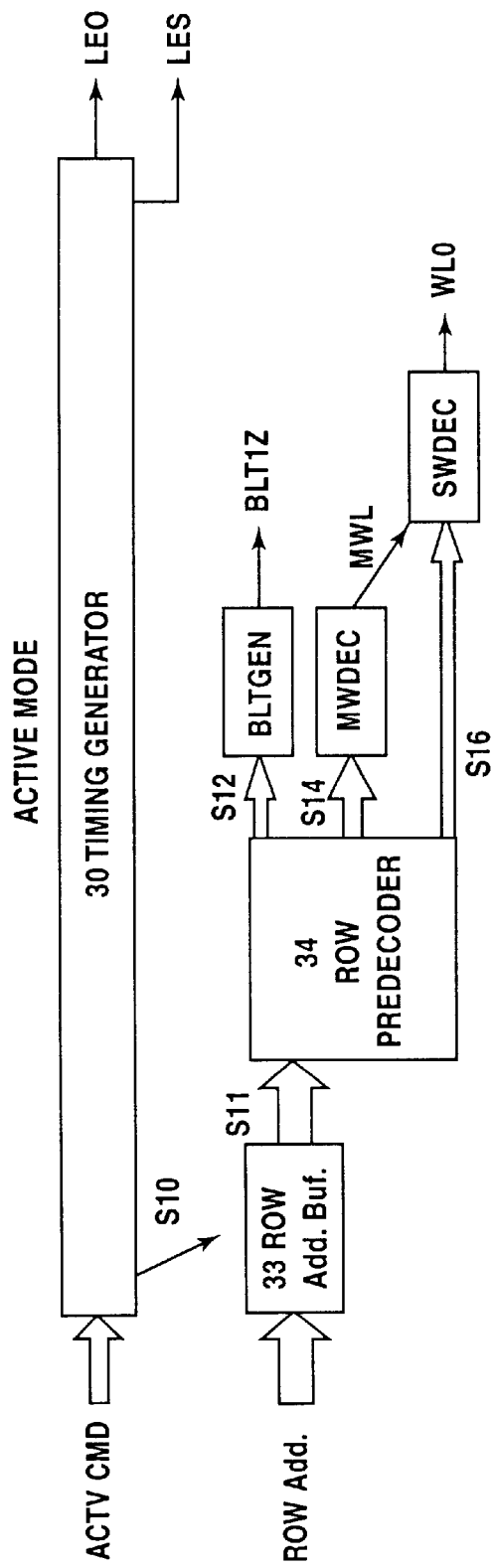
FIG. 4 is a configuration diagram of a peripheral circuit for explaining the active mode operation.
Figure 5:
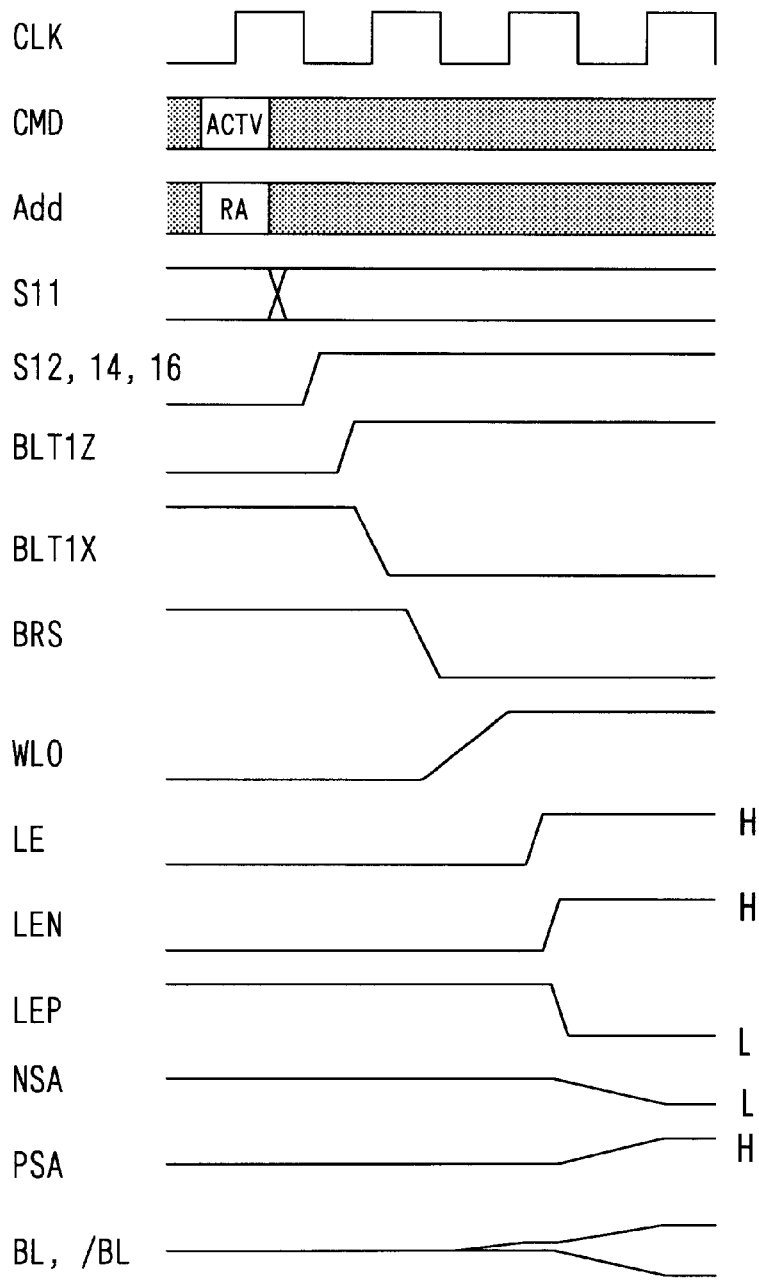
FIG. 5 shows a waveform of the active mode operation.

FIG. 4 is a configuration diagram of a peripheral circuit for explaining the operation in the active mode. FIG. 5 shows an operation waveform in the active mode. The active mode operation will be described with reference to the configuration diagrams of FIGS. 3 and 4 and to the operation waveform diagram of FIG. 5.

When an active command ACTV is fed through a command input terminal CMD in synchronism with the leading edge of a clock CLK, a row address RA is fetched as an address input Add into a row address buffer 33 for the output of an internal row address S11. The internal row address S11 is input to a row predecoder 34 to provide row predecoder outputs S12, S14 and S16 as a result of decoding. Some S12 of the row predecoder outputs are fed to the bit line transfer signal generation circuit BLTGEN which in this example causes a bit line transfer signal BLT1Z to go high.

That is, from the state of FIG. 3 where both the pair of bit line transfer signals BLT0z and BLT1z are low, this active command allows one bit line transfer signal BLT1z to go high. This means that the bit line pairs on the right of FIG. 3 are isolated from the sense amplifier circuit part and that the bit line pairs on the left are selected. That is, the inverter 18 allows the bit line transfer signal BLT1x to go low, rendering both the right-hand bit line transfer gates N11 and N12 inactive, to isolate the sense amplifier S/A and the right-hand bit line pairs BL, /BL from each other.

Furthermore, as shown in FIG. 3, when the bit line transfer signal BLT1z goes high, the NOR gate 10 of the main sense amplifier control circuit MSAC results in low level output enabling state, whereupon the bit line reset signal BRS goes low by the NOR gate 20 of the sub sense amplifier control circuit SSAC, rendering all the transistors N1, N2 and N3 inactive.

The low reset signal BRS results in a high level block selection signal φBLK, and the data bus gate DBG becomes active, connecting the selection block local data bus pairs LDB, /LDB to the global data bus pairs GDB, /GDB. Then, the reset signal BRS goes low, rendering the transistors N24 and N25 of the sense amplifier activation signal generation circuit 24 inactive, to isolate the sense amplifier activation signals PSA and NSA from the precharge level VPR.

As shown in FIG. 4, the remaining outputs S14 and S16 of the row predecoder 34 are fed to the main word decoder MWDEC and the sub word decoder SWDEC where in this example a main word line MWL and a word line WL0 are selected, respectively, for the drive into a high level. Upon the rise of the word line WL0, data of the memory cell MC are output to a bit line BL0 so as to slightly raise or lower the bit line BL0 depending on the storage data.

Afterward, the timing generator 30 allows an internal sense amplifier activation timing signal LE0 to go high at the timing set by the active command. At that time, the timing generator 30 provides as its output a selection signal LES or selecting the internal timing signal LE0.

As a result, at the timing of the internal sense amplifier activation timing signal LE0, the sense amplifier activation timing signal LE goes high by the timing signal selection circuit LE-SW shown in FIG. 3 and is then fed to the transistors N20 and P21 to render the output φLE of the NOR gate low. This allows other sense amplifier activation timing signals LEN and LEP to go high and low, respectively, to render both the transistors N26 and P23 of the generation circuit 24 active. As a result, the sense amplifier activation signals NSA and PSA result in the ground voltage VSS and the power supply voltage VDD, respectively, to drive the sense amplifier S/A. Due to this sense amplifier activation, an inter-bit line minute voltage is detected and the bit line pair are driven into the power supply level and the ground level.

The above is the operations in the active mode presented by the active command.

Figure 6:
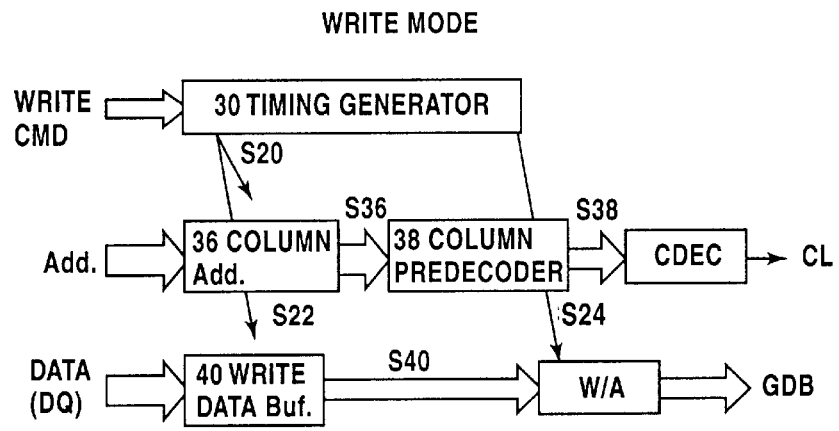
FIG. 6 is a block diagram of a peripheral circuit part for explaining the write mode operation.
Figure 7:
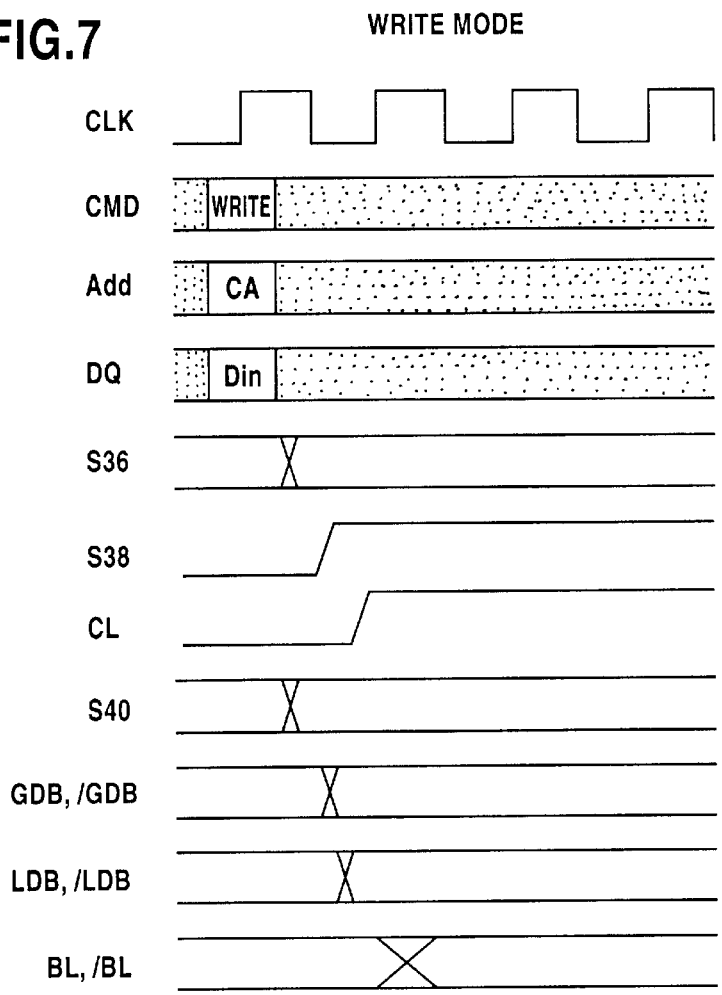
FIG. 7 shows a waveform of the write mode operation.

FIG. 6 is a block diagram of the peripheral circuit part, for explaining the operations in the write mode. FIG. 7 depicts a operation waveform in the write mode. At a predetermined timing after the active command ACTV, a write command WRITE is issued in synchronism with the leading edge of the clock CLK. At that time, a column address CA and write data Din are also fed from the address input Add and the data input/output terminal DQ, respectively, in synchronism with the leading edge of the clock CLK, and are fetched into a column address buffer 36 and a write data buffer 40, respectively.

An internal column address S36 is input to a column predecoder 38 for being decoded therein, with an output S38 being fed to a column decoder CDEC. The column decoder CDEC renders one column selection signal CL within the memory bank high. In response to the thus selected column selection signal CL, both the column selection gates N5 and N6 of FIG. 3 become active, connecting the selected bit line pair BL, /BL to the local data bus pair LDB, /LDB. As a result, the selected bit line pair BL, /BL are connected to the write amplifier WA by way of the local data bus pair LDB, /LDB, and the global data bus pair GDB, /GDB.

On the other hand, write data Din are fetched into a write data buffer 40 and internal write data S40 are fed to the write amplifier WA. In compliance with the internal write data S40, the write amplifier WA drives a pair of bit lines BL and /BL selected in the memory bank into high and low levels, respectively. In case of writing opposite phase data, the write amplifier inverts the state of the sense amplifier S/A simultaneously with the bit line pair drive.

In cases where a read command is given, the column selection signal CL goes high so that the state of the bit line pair read by the sense amplifier is transmitted via the data bus pair to the output circuit.

As described above, upon the ordinary write operation, within at least the memory bank a single bit line pair are connected to the write amplifier by way of the local data bus pair and the global data bus pair such that while the sense amplifier being activated, the write amplifier WA drives the selected bit line pair and also inverts the activated sense amplifier.

Description will then be made of the operations in the stress testing mode in this embodiment. In this stress testing mode, more bit line pairs (preferably all bit line pairs) than the ordinary operations are connected to the write amplifier, then while the sense amplifier being inactivated, the write amplifier applies a high or low level of voltage to the bit line pairs, and the sense amplifiers corresponding to the bit line pairs are activated at the timing after the elapse of predetermined time thereafter. The activation of the sense amplifier ensures that a sufficient voltage stress is applied to the bit line pair. In such a case, the word lines may appropriately be driven into a high level. In case of driving the word lines, high and low level of voltages can be applied not only between the bit line pair but also between the memory cells to apply a stress therebetween, thereby making defectiveness between the memory cells apparent.

Figure 8:
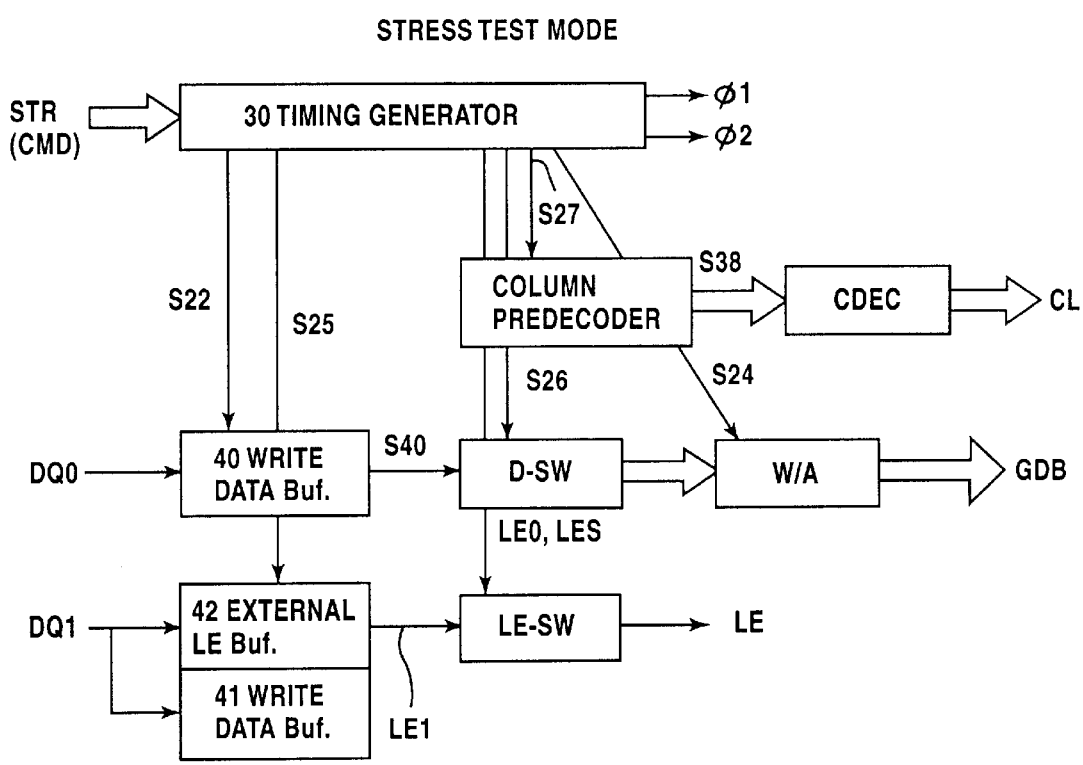
FIG. 8 is a block diagram of a peripheral circuit part for explaining the stress testing mode operation.
Figure 9:
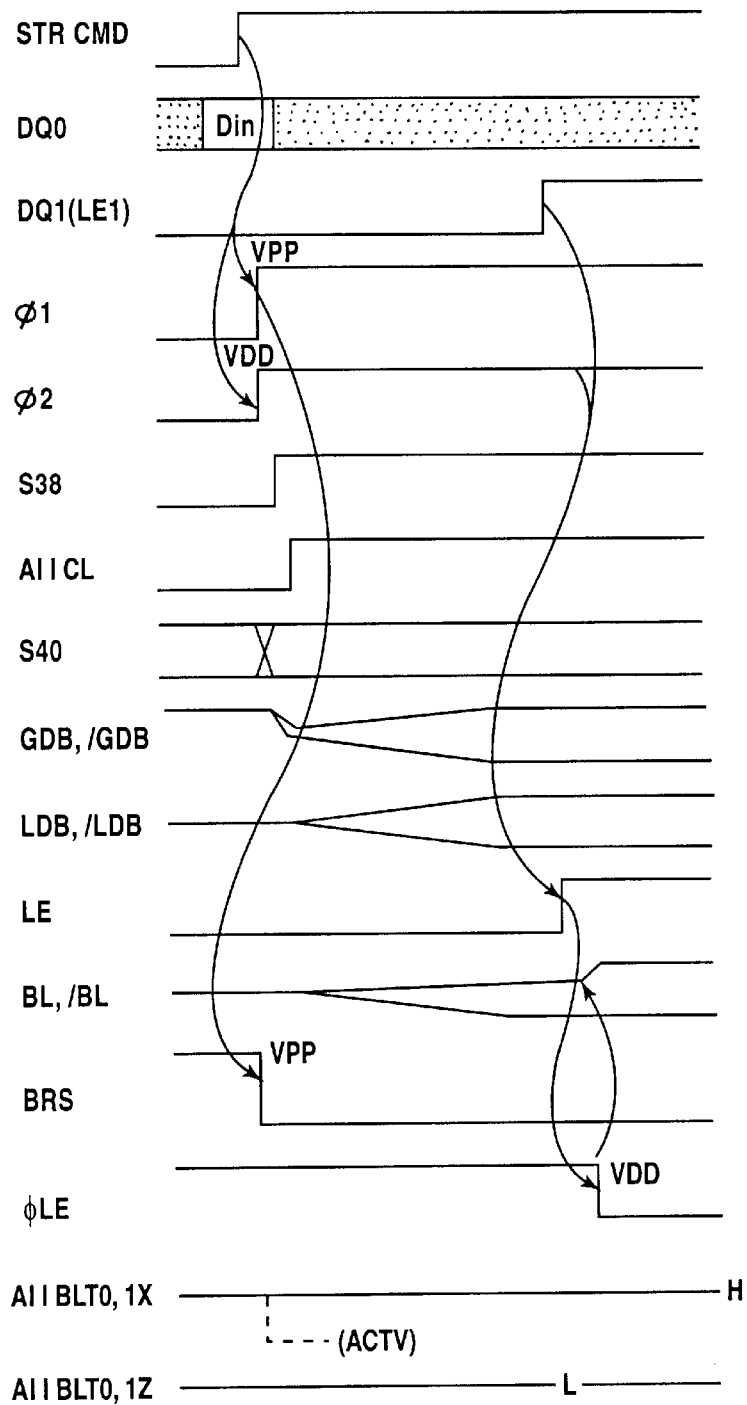
FIG. 9 shows a waveform of the stress testing mode operation.

FIG. 8 is a block diagram of a peripheral circuit part, for explaining the operations in the stress testing mode. FIG. 9 depicts an operation waveform in the stress testing mode.

In the circumstances where the memory device is in its standby state, the memory device enters the stress testing mode by externally feeding a stress command STR. The stress command STR may be provided in the form of a stress command signal by use of a specific input terminal capable of being utilized only upon the testing in the wafer state or may be provided in the form of a specific stress command different from the command used for the ordinary usage, the specific stress command being input through the command terminal CMD.

Simultaneously with the stress command STR, the input/output terminal DQ0 externally receives data Din corresponding to the direction of stress to be applied to the bit line pair. Another input/output terminal DQ1 is fed with a sense amplifier activation timing signal LE1, however the signal LE1 is in inactivated state (low level) upon the feed of the stress command STR.

When the stress command STR is given, the timing generator 30 responds to that command to allow the stress testing mode signals φ1 and φ2 to go high and to further generate control signals S22 to S27 at a predetermined timing. The stress testing mode signals φ1 and φ2 are the same logical signals but differ in that the high level of the signal φ1 is equal to the step-up power supply VPP level and that the high level of the signal φ2 is equal to the power supply VDD level.

The stress testing mode signals φ1 and φ2 are fed to control circuits MSAC and SSAC of at least a plurality of memory blocks within the memory bank. More preferably, the signals are fed to the control circuits MSAC and SSAC of all the memory blocks within the memory bank.

As shown in FIG. 3, the stress testing mode signal φ1 of high level results in a bit line reset signal BRS of low level, rendering the transistors N24 and N25 in active to isolate the sense amplifier activation signals PSA and NSA from the precharge voltage VPR. The bit line reset signal BRS of low level results in a block selection signal φBLK of high level, rendering active the data bus gate DBG connecting the global data bus pair GDB, /GDB to the local data bus pair LDB, /LDB, to allow at least a plurality of local buses within the memory bank to be connected to the global data buses. More preferably, all the local data buses are connected to the global data buses.

Furthermore, the bit line reset signal BRS of low level renders the transistors N1, N2 and N3 inactive, to isolate a plurality of, preferably all bit line pairs within the memory core from the precharge voltage VPR.

When the other stress testing mode signal φ2 goes high, the output of the NOR gate 10 of the main sense amplifier control circuit MSAC is put in the low level enabling state. That is, there results the state where the sense amplifier activation signal LE is transmitted to the subsequent timing signals LEP and LEN.

In response to a control signal S27 from the timing generator 30, the output S38 of the column predecoder 38 is put in plural selection state, preferably, in all selection state. This allows an all column selection signal CL to be put in selected state (high level). Due to the change to the selected state of the all column selection signal CL, all the bit line pairs BL, /BL are connected to the corresponding local data bus pairs LDB, /LDB, whereupon all the bit line pairs BL, /BL can be connected to the write amplifier WA by way of the local data bus pairs LDB, /LDB and the global data bus pairs GDB, /GDB.

The write data buffer 40 connecting to the data input/output terminal DQ0 is activated in response to the control signal S22 so that the input data Din are transferred internally as the internal write data S40. In this embodiment, the internal write data S40 are temporarily fed to a data switching circuit D-SW. The data switching circuit D-SW upon the ordinary operation feeds a plurality of simultaneously input write data to the corresponding write amplifiers WA, whereas upon the stress testing mode it feeds only the input data of the data input/output terminal DQ0 to all the write amplifiers WA. The write data fed to the write amplifiers WA are sent to the global data bus pair GDB, /GDB, whereupon all the bit line pairs BL, /BL are subjected to high and low voltages corresponding to the input data to the data input/output terminal DQ0. Since the sense amplifier is inactivated at that time, the write amplifier can simultaneously drive a plurality of bit line pairs, preferably all bit line pairs. It is to be noted that this drive needs a certain time. As shown, the levels of the plurality of bit line pairs gradually migrate from the precharge level VPR (VDD/2) toward the high and low levels.

Upon the ordinary operation, the write amplifier WA writes data into only a single sense amplifier S/A by way of the global data bus GDB and the local data bus LDB, whereas in the stress testing mode it must perform simultaneous writing into a multiplicity of sense amplifiers S/A connecting to the same global data bus GDB.

In such a case, if the multiplicity of sense amplifiers S/A retain opposite phase data to the write data, then the write amplifier is incapable of inverting the plurality of sense amplifier, resulting in write unable. Thus, in the stress testing mode, the write amplifier WA applies high and low level of voltages to a plurality of bit line pairs while rendering the sense amplifier S/A inactivated. In spite of the inactivated state of the sense amplifier S/A, it takes elongated time for the input data to reach all bit line pairs BL, /BL.

Furthermore, since the column gate transistors N5 and N6 receiving the column selection signal CL are the N-channel transistors as shown in FIG. 3, even though the input data reach the bit line pair BL, /BL, the bit line of high level can merely rise up to a level lower than the difference (VDD−Vth) between the power supply VDD which is the high level of the column selection signal CL and the threshold voltage Vth.

Thus, in the stress testing mode, the sense amplifier activation timing signal LE1 is externally fed by way of the input/output terminal DQ1 after the application by the write amplifier of high and low level of voltages to all the bit line pairs during a certain elongated period of time. The activation of the sense amplifier S/A is carried out at the timing when the input/output terminal DQ1 is rendered high.

In the stress testing mode, the input of the input/output terminal DQ1 is sent to an external LE buffer 42 activated via a control signal S25 by the timing generator 30 and is then transmitted to the LE switching circuit LE-SW. The LE switching circuit LE-SW upon the ordinary operation feeds an internal sense amplifier activation timing signal LE0 generated by the timing generator 30 as the timing signal LE to the main sense amplifier control circuit MSAC. In the stress testing mode, on the other hand, it feeds an external sense amplifier activation timing signal LE1 from the external LE buffer 42 as the sense amplifier activation timing signal LE to the main sense amplifier control circuit MSAC. This allows a change of the input/output terminal DQ1 to be transmitted to the sense amplifier activation timing signal LE and then transmitted by the main sense amplifier control circuit MSAC shown in FIG. 3 to the timing signals LEP and LEN, to eventually activate all the sense amplifiers S/A. As a result of the activation of the sense amplifiers S/A, the high bit line potential goes up to the power supply VDD level so that sufficient stress is applied to the bit line pairs.

The above described system enables desired potentials to simultaneously be applied to all the bit line pairs of the memory device.

Upon the ordinary operation a single bit line pair is connected to the write amplifier within the memory bank, whereas in the stress testing mode the stress testing can be made in a shorter period of time than in the prior art by connecting a plurality of bit line pairs, at least more than the ordinary operation within the memory bank. Then, more preferably all the bit line pairs are connected to the associated write amplifiers so that stress is applied to all the bit line pairs at a time. More preferably, they are driven into high levels of all the word lines so that all the memory cells are connected to the bit line pairs when applying a voltage stress to the bit line pairs.

Although in the example of FIG. 8 the timing generator 30 issues the control signals S27 and S25 to the column predecoder 38 and the external LE buffer 42, those control signals S27 and S25 could be substituted by the stress testing mode signals φ2.

It is further possible in the above stress testing mode to apply a voltage stress between adjacent memory cells by putting all the word lines in the selected state.

Furthermore, in the stress testing mode, the timing signals activating the sense amplifiers may be generated by an internal timing generator at a different timing from the ordinary operation, in response to a stress testing command.

Upon the stress testing, according to the present invention, it is possible for the write amplifier to simultaneously apply high and low level of voltages to more bit line pairs than in the ordinary write mode, and thus to shorten the time required for the stress testing.

The scope of protection for the present invention is not limited to the above embodiments but covers the inventions as defined in the appended claims and equivalents thereof.

What is claimed is:

1. A dynamic memory device having a plurality of bit line pairs, a plurality of word lines, and a plurality of memory cells disposed at intersections thereof, the dynamic memory device comprising:

a data bus to which a write amplifier is connected; and sense amplifiers provided to each of the bit line pairs, for amplifying voltage between the bit line pairs;

wherein in stress testing mode, a plurality of said bit line pairs are commonly connected to the data bus, the write amplifier applies high and low voltages to the simultaneously connected bit line pairs, thereafter the sense amplifiers associated with the selected bit line pairs are activated.

2. The dynamic memory device according to claim 1, wherein upon the ordinary write mode, after activating the sense amplifier the write amplifier applies high and low level of voltages to the bit line pair selected depending on the write data.

3. The dynamic memory device according to claim 2, further comprising:
  a data input/output terminal through which write data are fed to the write amplifier,
  wherein in the stress testing mode the write amplifier applies a voltage to the connected bit line pairs in compliance with write data fed through the data input/output terminal.

4. The dynamic memory device according to claim 1, wherein upon the stress testing mode, a sense amplifier activation timing signal is externally fed at a timing when the sense amplifier is activated.

5. The dynamic memory device according to claim 1, wherein upon the stress testing mode, a sense amplifier activation timing signal is internally fed at a timing when the sense amplifier is activated.

6. The dynamic memory device according to claim 1, further comprising:
  a plurality of memory banks each having the bit line pairs, the word lines, the memory cells and the sense amplifier,
  wherein in the ordinary write mode, selected bit line pair is connected to the data bus in each of the plurality of memory banks, and wherein in the stress testing mode, said plural bit line pairs are commonly connected to the data bus within the memory bank.

7. The dynamic memory device according to claim 6, wherein upon the stress testing mode, all the bit line pairs are commonly connected to the data bus within the memory bank.

8. The dynamic memory device according to claim 1,
  wherein the data bus includes a plurality of local data buses connected via a first gate to the bit line pairs, and a global data bus connected via a second gate to the local data buses, the write amplifier being connected to the global data bus,
  wherein in the ordinary write mode, selected local data bus is connected via the second gate to the global data bus, and in the stress testing mode, a plurality of local data buses are connected via the second gate to the global data bus, the write amplifier applying high and low level of voltages to the plurality of bit line pairs by way of the global data bus and the plurality of local data buses.

9. The dynamic memory device according to claim 8,
  wherein upon the stress testing mode, all the local data buses are connected to the global data bus within the memory bank, all the bit line pairs are connected to the local data buses, and all the sense amplifiers are put in activation.

10. The dynamic memory device according to claim 1,
  wherein upon the stress testing mode, selection is made of all the word lines.

11. A dynamic memory device having a plurality of bit line pairs, a plurality of word lines, and a plurality of memory cells disposed at intersections thereof, the dynamic memory device comprising:
  a data bus to which a write amplifier is connected; and
  sense amplifiers provided on the bit line pairs, for driving the bit line pairs, wherein
  in a first operation mode, selected bit line pair is connected to the data bus after activation of the sense amplifiers, the write amplifier applying high and low level of voltages to the selected bit line pair, and
  in a second operation mode, more bit line pairs than the first operation mode are connected to the data bus, the sense amplifiers are activated after an application of high and low level of voltages to the connected bit line pairs by the write amplifier.

12. The dynamic memory device according to claim 11, wherein, the first operation mode is an ordinary write mode, and the second operation mode is a stress testing mode.

* * * * *